United States Patent
Hashizume

(10) Patent No.: US 6,432,733 B1
(45) Date of Patent: Aug. 13, 2002

(54) METHOD FOR PRODUCING AN OPTICAL MODULE

(75) Inventor: Hideki Hashizume, Osaka (JP)

(73) Assignee: Nippon Sheet Glass Company, Limited, Osaka (JP)

(*) Notice: Subject to any disclaimer, the term of this patent is extended or adjusted under 35 U.S.C. 154(b) by 0 days.

(21) Appl. No.: 09/463,459
(22) PCT Filed: Jul. 28, 1998
(86) PCT No.: PCT/JP98/03363
§ 371 (c)(1), (2), (4) Date: Jan. 27, 2000
(87) PCT Pub. No.: WO99/07044
PCT Pub. Date: Feb. 11, 1999

(30) Foreign Application Priority Data

Jul. 30, 1997 (JP) .............................. 9-219135

(51) Int. Cl.⁷ .............................. H01L 21/00
(52) U.S. Cl. ............................ 438/22; 438/32
(58) Field of Search .............. 438/22, 23, 24, 438/25, 30, 32, 59, 403, 495

(56) References Cited

U.S. PATENT DOCUMENTS

| 5,347,604 A | * 9/1994 | Go et al. | 385/92 |
| 5,537,504 A | * 7/1996 | Chen et al. | 385/88 |
| 5,973,862 A | * 10/1999 | Hashizume | 359/819 |
| 6,123,465 A | * 9/2000 | Hashizume | 385/93 |
| 6,157,012 A | * 12/2000 | Tanaka et al. | 219/633 |

FOREIGN PATENT DOCUMENTS

| JP | 52-110222 | 9/1977 |
| JP | 59-118517 | 8/1984 |
| JP | 59-143113 | 8/1984 |
| JP | 60-205401 | 10/1985 |
| JP | 7-80834 | 3/1995 |
| JP | 8-11142 | 1/1996 |
| JP | 8-15576 | 1/1996 |
| JP | 8-15577 | 1/1996 |
| JP | 8-60001 | 3/1996 |
| JP | 9-80270 | 3/1997 |
| JP | 9-96743 | 4/1997 |

OTHER PUBLICATIONS

K.K. Purasuchikku Eji.; Injection Molding (Japan), p. 232.

* cited by examiner

Primary Examiner—David Nelms
Assistant Examiner—Phuc T. Dang
(74) Attorney, Agent, or Firm—Whitham, Curtis & Christofferson, P.C.

(57) ABSTRACT

A method of producing an optical module having an optoelectronic semiconductor device, a lens, and a resin housing provided with a portion for mounting the optoelectronic semiconductor device, the lens being built into the resin housing, the optoelectronic semiconductor device being mounted in the resin housing so that the lens and the optoelectronic semiconductor device are positioned coaxially, wherein a primarily molded piece (20) is produced with a resin by insert-molding a spherical lens (12) so as to hold the spherical lens, and then, the primarily molded piece is secondarily molded with a resin into a final shape of a housing having an optoelectronic semiconductor device mount portion (16) and a receptacle bore (18) by further insert-molding the primarily molded piece. In this manner, the resin housing (14) with the built-in spherical lens is produced in the two molding steps. The lens can be fixed to the housing speedily and easily without using any resin adhesive agent or any welding glass. Moreover, the optical module is excellent in weather resistance and high in reliability and can be produced inexpensively.

10 Claims, 2 Drawing Sheets

METHOD FOR PRODUCING AN OPTICAL MODULE

TECHNICAL FIELD

The present invention relates to a method of producing an optical module in which a semiconductor light-emitting device or a semiconductor photodetecting device and a lens are center-aligned with each other and held by a resin housing. More specifically, the present invention relates to a method of producing an optical module in two insert molding steps in which a primarily molded piece produced so as to hold a lens by insert-molding is secondarily molded into a final housing shape by further insert molding.

BACKGROUND ART

An optical module is a part in which an optoelectronic semiconductor device (e.g., a semiconductor light-emitting device such as a semiconductor laser or the like, or a semiconductor photodetecting device such as a photodiode or the like) and a lens are center-aligned with each other and held. Such an optical module is used in the field of optical communication, and so on. For example, in a computer system by which data communication is conducted, a module of a semiconductor light-emitting device and a module of a semiconductor photodetecting device are disposed on a board so as to be paired with each other. Such a module is comprised of an optoelectronic semiconductor device, a lens, and a housing for holding the optoelectronic semiconductor device and the lens and for fittingly holding a ferrule of a counter optical plug. The module has a structure in which, when the optical plug is connected, the optoelectronic semiconductor device is optically coupled with an optical fiber in the ferrule through the lens. Generally, a holder portion for holding both the optoelectronic semiconductor device and the lens and a receptacle portion for fittingly holding the ferrule of the optical plug are produced as separate members of the housing. A structure in which the holder portion and the receptacle portion are center-aligned with each other and fixed is employed in the housing.

A spherical lens or a refractive index-distributed rod lens is generally used as a lens to be incorporated in an optical module. It is a matter of course that a lens having a shape other than the above-mentioned lenses may be used. Among these lenses, a spherical lens is widely used because of its advantages that a highly accurate product can be obtained easily only by mechanical processing and hence can be produced at a low cost, and that the lens has no directionality so that it is not required to adjust the direction when the lens is to be mounted in an optical module and the assembling of the optical module is facilitated. As methods of fixing a lens to a holder portion, there are employed an adhesion method in which a resin adhesive agent is applied onto the periphery of the lens and thermally hardened after the lens is dropped and positioned into a recess (lens mount portion) of the holder portion, a welding method in which a molded product of a low-melting-point glass ring slightly larger than the outer diameter of the lens is put on the outer circumference of the lens and melted by heat, and so on.

The adhesion method has a difficulty in handling a liquid adhesive agent before thermal hardening because the liquid resin adhesive agent must be poured into a narrow region. Furthermore, there is a fear in that heat-cracking may occur in an adhesive surface of the lens because of the difference in thermal expansion coefficient between the lens and the holder portion which is generally formed from a metal material.

On the other hand, the glass welding method has problems in devitrification (cloudiness) and reduction of the strength of fixation due to being left as it is in high-temperature and high-humidity environment, increase of the cost, and so on. The molded product of a low-melting-point glass ring to be used in the welding method is obtained by green-compact-molding of low-melting-point glass powder. During the process of dropping the molded product of a low-melting-point glass ring into a predetermined position, fine broken pieces or powder may be therefore scattered and deposited on a surface of the lens. If a heat melting process is conducted under the condition in order to fix the lens, the broken glass pieces or powder deposited on the surface of the lens are melted, and the low-melting point glass itself penetrates so that films of low-melting point glass are locally formed on the surface of the lens, and so on. Since low-melting point glass is particularly easily affected by moisture, devitrification is often produced with the passage of time. If devitrified portions are formed, reduction of the light amount occurs. Moreover, the moisture causes a phenomenon of easily forming fine cracks in the surface of the glass pool and the glass becomes brittle. Accordingly, the strength of the fixation of the lens is reduced. In an extreme case, there is a fear that the lens may drop off. In order to solve these problems, a countermeasure to the moisture is required to be taken separately. Moreover, the molded product of a low-melting-point glass ring is expensive. As a result, the cost is increased inevitably.

An object of the present invention is to provide a method of producing an optical module in which a lens can be fixed to a housing without using any resin adhesive agent or any welding glass and in which a product excellent in weather resistance and high in reliability can be obtained inexpensively.

DISCLOSURE OF THE INVENTION

The present invention relates to a method of producing an optical module including an optoelectronic semiconductor device, a lens, and a resin housing provided with a portion for mounting the optoelectronic semiconductor device, the lens being built into the resin housing, the optoelectronic semiconductor device being mounted in the resin housing so that the built-in lens and the optoelectronic semiconductor device are positioned coaxially. Here, the present invention provides such an optical module producing method in which the resin housing is molded through two molding steps of: producing a primarily molded piece with a resin by insert-molding a lens so that the lens is held in the primarily molded piece; and secondarily molding the primarily molded piece with a resin into a final shape of the housing having the optoelectronic semiconductor device mount portion by further insert-molding the primarily molded piece to thereby form the resin housing with the built-in lens. The present invention has a feature in this point.

The present invention further relates to a method of producing an optical module including an optoelectronic semiconductor device, a lens, and a resin housing provided with a portion for mounting the optoelectronic semiconductor device and with a receptacle bore for fittingly holding a ferrule of a counter optical plug, the lens being built into the resin housing, the optoelectronic semiconductor device being mounted in the resin housing so that the optoelectronic semiconductor device is optically coupled with an optical fiber in the ferrule by the lens when the optical plug is connected. Here, the present invention provides such an optical module producing method in which the resin housing is molded through two molding steps of: producing a primarily molded piece with a resin by insert-molding a lens so that the lens is held in the primarily molded piece; and secondarily molding the primarily molded piece with a resin into a final shape of the housing having the optoelectronic semiconductor device mount portion and the receptacle bore by further insert-molding the primarily molded piece to thereby form the resin housing with the built-in lens. The present invention has a feature in this point.

In an optical module, a lens incorporated therein is very small and it is required to be held by thin core pins in a mold. Therefore, a primary mold having a relatively small cavity portion is first used so that a small piece around the lens is molded while the lens is held by short core pins in the primary mold. The primarily molded piece molded thus holds the lens and has a size to some extent. It is therefore possible to use thick core pins to hold the primarily molded piece in a secondary mold. Accordingly, the holding stiffness of the core pins can be enhanced. Moreover, a secondarily molded product can be designed so that the thickness of the secondarily molded product as a whole is made substantially uniform. Hence, partial "sinks" (cavities caused by shrinkage in molding) are never produced. Accordingly, a good molded product integrated with the resin housing is obtained.

DESCRIPTION OF REFERENCE NUMERALS

Figure 1:
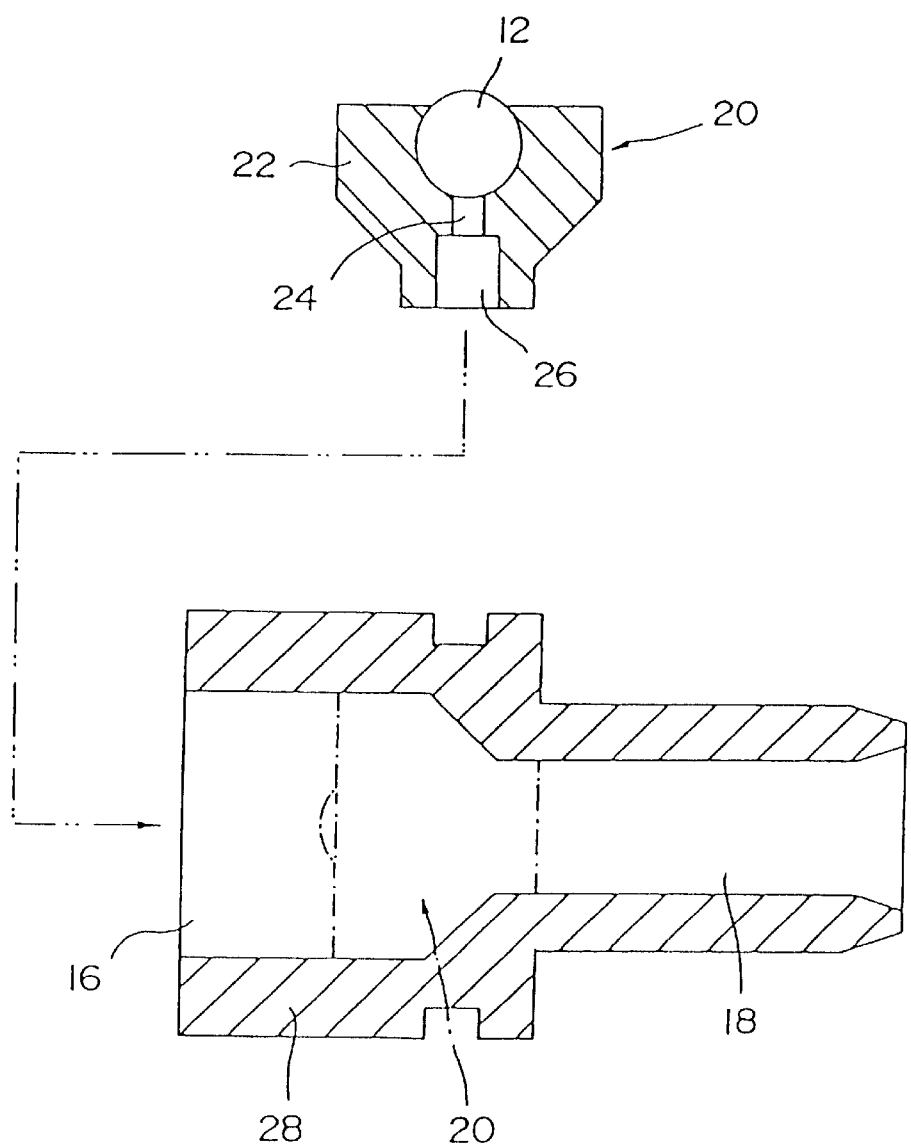
FIG. 1 is a diagram for explaining steps of an embodiment of a method of producing an optical module according to the present invention.

| | |
|---|---|
| 10 | optoelectronic semiconductor device |
| 12 | spherical lens |
| 14 | resin housing |
| 16 | optoelectronic semiconductor device mount portion |
| 18 | receptacle bore |
| 20 | primarily molded piece |
| 22 | primarily molding resin portion |
| 24, 26 | through-hole |
| 28 | secondarily molding resin portion |
| 32 | adhesive agent |

BEST MODE FOR CARRYING OUT THE INVENTION

In the present invention, the shape of a lens to be inserted is not specified. As described above, a spherical lens is however particularly convenient because the spherical lens is inexpensive and has no directionality when it is held in a mold. It is a matter of course that a refractive index-distributed rod lens, or the like, may be used. In any case, a resin is molded into such a shape that the lens is prevented from dropping off after molding. It is, however, a matter of course that the lens to be used is formed from a material which is not denatured/deformed at the temperature and pressure in injection molding. A product of a glass material is used generally.

Although a resin material to be used for the primary molding and a resin material to be used for the secondary molding may be different from each other, it is preferably to use one and the same kind of resin as the two resin materials. This is because the characteristics such as linear expansion coefficients, or the like, of the two resin materials coincide with each other and hence the two resin materials can be thoroughly integrated with each other. Because the tolerance of a portion of the resin fitted to a ferrule of an optical fiber needs to be suppressed to be about 5/1000 mm in a temperature range of from about −20° C. to about +75° C., a material with a small linear expansion coefficient (specifically, of about $2 \times 10^{-5}/°$ C.) is preferably used as the resin material. It is, however, possible to use a resin with a linear expansion coefficient up to about $7 \times 10^{-5}/°$ C. in accordance with the used temperature condition, and so on. Such a resin belongs to a category called engineering plastics. For example, in the category of engineering plastics, there are liquid-crystal polymer (LCP), polyether ether ketone (PEEK), polyether imide, polyphenyl sulfide (PPS), polybutylene terephthalate (PBT), polyphenylene ether (PPE), polycarbonate (PC), polyamide, etc. When the linear expansion coefficient is too large, it is effective to mix a suitable amount of glass filler, glass beads, or the like, with the resin. The mean grain size of glass beads is preferably set to be not larger than about 30 μm. On this occasion, small grain size is preferable but causes increase in cost. Particularly, when a liquid-crystal polymer containing evenly dispersed glass beads with a mean grain size of from about 2 μm to about 20 μm is used, a good result is obtained.

In the present invention, the optoelectronic semiconductor device to be mounted in the resin housing is a semiconductor light-emitting device such as a semiconductor laser, a light-emitting diode, or the like; or a semiconductor photodetecting device such as a photodiode, a built-in preamplifier type photodiode, or the like.

Embodiment

Figure 2:
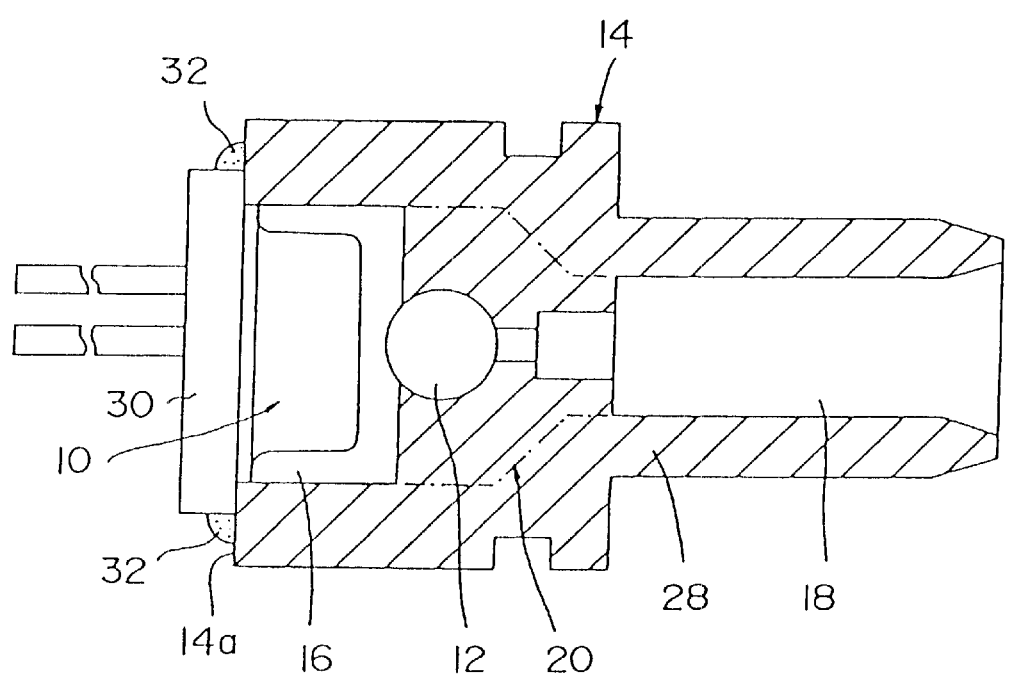
FIG. 2 is a diagram for explaining the whole of the optical module produced by the method of the present invention.

FIG. 1 is a diagram for explaining the steps of an embodiment of a method of producing an optical module according to the present invention. FIG. 2 is a diagram for explaining the whole of the optical module produced by the method. As shown in FIG. 2, the optical module in this embodiment includes an optoelectronic semiconductor device 10, a spherical lens 12, and a resin housing 14. The resin housing 14 has a structure in which the spherical lens 12 is built into the resin housing 14, and in which the resin housing 14 has an optoelectronic semiconductor device mount portion 16 and a receptacle bore (hollow portion) 18 for fittingly holding a ferrule (not shown) of a counter optical plug. The optical module is produced by mounting the optoelectronic semiconductor device 10 in the resin housing 14 so that the optoelectronic semiconductor device 10 is optically coupled with an optical fiber in the ferrule by the spherical lens 12 when the optical plug is connected.

As shown in FIG. 1, a primarily molded piece 20 which holds the spherical lens 12 is first produced from a resin by insert-molding the spherical lens 12. For example, the spherical lens 12 incorporated in the primarily molded piece 20 has a fine spherical body with a diameter of about 2 mm. In the condition that the spherical lens 12 is held while being sandwiched between two thin core pins with a diameter of about 0.6 mm in a primary mold, a resin is injected into the primary mold under a high pressure. On this occasion, a vertical-type injection-molding machine is used because a horizontal-type injection-molding machine can hardly hold the fine spherical lens 12 in a correct position securely. The primarily molded piece 20 may be a small piece so long as the primarily molded piece 20 has a size enough to hold the spherical lens 12 and facilitate the next step. Accordingly, the core pins for holding the spherical lens 12 can be shortened, so that the holding stiffness of the core can be improved in spite of its small diameter.

The primarily molded piece 20 is formed so that at least a half of the spherical lens 12 is buried in a primarily molding resin portion 22 to thereby prevent the spherical lens 12 from dropping out of the primarily molded piece 20. In this embodiment, the primarily molded piece 20 is formed in a condition that about 85% of the spherical lens 12 is buried in the resin portion 22 to make the peripheral resin limit the pupil size to thereby prevent unnecessary light from penetrating through the periphery of the lens. A part of the spherical lens 12 is exposed so as to protrude from the resin portion 22. A through-hole 24 of small caliber and a through-hole 26 of slightly large caliber are formed successively in the opposite side to the resin portion 22 so that the through-holes 24 and 26 serve as paths of a light beam.

Then, one and the same kind of resin is secondarily molded into a final shape of the housing having the opto-electronic semiconductor device mount portion 16 and the receptacle bore 18 by further insert-molding the primarily molded piece 20. A secondarily molded resin portion is designated by the reference numeral 28. In the condition that the primarily molded piece 20 is held while being sandwiched between a plurality of core pins in a secondary mold, the resin is injected into the secondary mold under a high pressure. On this occasion, the receptacle bore 18 requires accuracy of about 5/1000 mm. Therefore, a horizontal-type molding machine is used for the secondary molding because a vertical-type molding machine can hardly obtain high stiffness to thereby make it difficult to achieve such high accuracy.

In the secondary molding, the primarily molded piece 20 to be inserted has a somewhat large size and hence it is easy to handle the primarily molded piece 20. Moreover, the core pins for holding the primarily molded piece 20 can be thickened and hence holding stiffness can be enhanced. Accordingly, the secondary molding can be performed sufficiently even by a horizontal-type molding machine. Further, design can be made so that the thickness of the secondarily molded resin portion 28 is made substantially uniform as a whole. Hence, partial "sinks" (cavities caused by shrinkage in molding) never occur. Specifically, the thickness of the secondarily molded resin portion 28 is preferably set so that the ratio of the largest value of the thickness to the smallest value of the thickness is not larger than 2:1. Paradoxically, the shape (particularly, the outer shape) of the primarily molded piece 20 is designed so that the thickness of the secondarily molded resin portion is made substantially uniform as a whole as described above.

One and the same kind of resin is preferably used in both the primary molding and the secondary molding. For example, it is preferable to use a liquid-crystal polymer of a low anisotropic grade containing about 50% by weight of dispersed glass beads with a mean grain size of about 20 μm. Although the liquid-crystal polymer itself is highly anisotropic in linear expansion coefficient (the linear expansion coefficient in a direction of the flow of the liquid-crystal polymer in injection molding is substantially zero while the linear expansion coefficient in a direction perpendicular to the flow direction is about $8 \times 10^5/°C$.), the anisotropy can be reduced by a suitable amount of glass beads dispersed in the liquid-crystal polymer (the linear expansion coefficients both in the flow direction in injection molding and in the direction perpendicular to the flow direction are about $2 \times 10^{-5}/°C$.). Hence, the coefficient of variation of the inner diameter 2.5 mmø of the receptacle bore can be suppressed to 5/1000 mm in a temperature range (from −20° C. to +75° C.) in which the optical module is used actually.

In this manner, as shown in FIG. 2, the optoelectronic semiconductor device 10 is mounted in the resin housing 14 obtained by insert-molding the spherical lens 12. The optoelectronic semiconductor device 10 has a structure in which a body of the device is received in a hermetically sealed package. A hermetically sealed package portion of the optoelectronic semiconductor device 10 is inserted and positioned in the mount portion 16 of the resin housing 14 so that a base portion 30 of the optoelectronic semiconductor device 10 abuts against an end portion 14a of the resin housing 14. After the hermetically sealed package portion of the optoelectronic semiconductor device 10 is positioned in the aforementioned manner, the periphery of the base portion 30 is fixed by a resin adhesive agent 32, or the like.

When an optical plug is connected to the optical module, a ferrule (not shown) of the optical plug is fitted into the receptacle bore 18. On this occasion, in the condition that the optoelectronic semiconductor device 10 is, for example, a semiconductor laser, the alignment of optical axes is achieved so that light emitted from the semiconductor laser is converged by the spherical lens 12 so as to be incident on an end face of an optical fiber in the ferrule. The through-hole 24 of small caliber pierced in the center of the primarily molded piece 20 performs a function of permitting only optical fiber coupled light to pass through the through-hole 24 while eliminating undesired light due to the aberration of the spherical lens itself, and so on. This function is performed by setting the caliber of the through-hole 24 to the irreducible minimum. When an optical plug is connected to the optical module in the condition that the optoelectronic semiconductor device 10 is, for example, a photodiode, the alignment of optical axes is achieved so that light emitted from the optical fiber in the ferrule is converged by the spherical lens 12 so as to be incident on the photodiode.

Although the aforementioned embodiment has shown the case where the receptacle portion is integrally molded as a part of the resin housing, the present invention can be applied also to a structure with no receptacle portion. Such an optical module having no receptacle portion may be used as it is. Alternatively, a receptacle portion may be produced separately and joined to an optical module. In such a manner, there is an advantage that a material of high durability against releasing/coupling of the ferrule of the optical fiber can be selected for the receptacle portion.

INDUSTRIAL APPLICABILITY

As described above, the present invention provides a method of producing an optical module in two insert molding steps in which a primarily molded piece produced so as to hold a lens by insert-molding is secondarily molded into a final housing shape by further insert-molding. Accordingly, the lens can be fixed to the resin housing without using any resin adhesive agent or any welding glass. Moreover, the optical module is excellent in weather resistance and high in reliability and can be produced inexpensively.

What is claimed is:

1. A method of producing an optical module which includes an optoelectronic semiconductor device, a lens, and a resin housing provided with a portion for mounting the optoelectronic semiconductor device, the lens being built into the resin housing, the optoelectronic semiconductor device being mounted in the resin housing so that the built-in lens and the optoelectronic semiconductor device are positioned coaxially, wherein a resin housing is molded through two molding steps of:
produce a primarily moldeded piece with a resin by insert-molding a lens so that the lens is held in the primarily molded piece; and
insert-molding the primarily molded piece into a secondarily molded resin portion for form a final shape of the housing having a lens and a portion for mounting an optoelectronic semiconductor device.

2. A method of producing an optical module which includes an optoelectronic semiconductor device, a lens, and a resin housing provided with a portion for mounting the optoelectronic semiconductor device and with a receptacle bore for fittingly holding a ferrule of a counter optical plug, the lens being built into the resin housing, the optoelectronic semiconductor device being mounted in the resin housing so that the optoelectronic semiconductor device is optically coupled with an optical fiber in the ferrule by the lens when the optical plug is connected, wherein a resin housing is molded through two molding steps of:
producing a primarily molded piece with a resin by insert-molding a lens so that the lens is held in the primarily molded piece; and
insert-molding the primarily molded piece into a secondarily molded resin portion to form a final shape of the housing having a portion for mounting an optoelectronic semiconductor device, a lens, and a receptacle bore.

3. A method of producing an optical module according to claim 1, wherein a vertical-type injection-molding machine is used for the producing step; and a horizontal-type injection-molding machine is used for the insert-molding step.

4. A method of producing an optical module according to claim 3, wherein one kine of liquid-crystal polymer containing evenly dispersed glass beads with a mean grain size of 30 $\mu$m or smaller is used in common to the resins used for the producing step and the insert-molding step.

5. A method of producing an optical module according to claim 2, wherein a vertical-type injection-molding machine is used for the producing step; and a horizontal-type injection-molding machine is used for the insert-molding step.

6. A method of producing an optical module according to claim 5, wherein one kind of liquid-crystal polymer containing evenly dispersed glass beads with a mean grain size of 30 $\mu$m or smaller is used in common to the resins used for the producing step and the insert-molding step.

7. The method of producing an optical module according to claim 1 wherein said lens is spherical.

8. The method of producing an optical module according to claim 2 wherein said lens is spherical.

9. The method of producing an optical module according to claim 1 wherein a resin used in said producing step for producing said primarily molded piece is the same as a resin used in said secondarily molded resin portion used in said insert-molding step.

10. The method of producing an optical module according to claim 2 wherein a resin used in said producing step for producing said primarily molded piece is the same as a resin used in said secondarily molded resin portion used in said insert-molding step.

* * * * *